US010735753B2

(12) United States Patent
Halawani et al.

(10) Patent No.: US 10,735,753 B2
(45) Date of Patent: Aug. 4, 2020

(54) DATA COMPRESSION USING MEMRISTIVE CROSSBAR

(71) Applicant: KHALIFA UNIVERSITY OF SCIENCE AND TECHNOLOGY, Abu Dhabi (AE)

(72) Inventors: Yasmin Halawani, Abu Dhabi (AE); Baker Mohammad, Abu Dhabi (AE); Mahmoud Al-Qutayri, Abu Dhabi (AE)

(73) Assignee: KHALIFA UNIVERSITY OF SCIENCE AND TECHNOLOGY, Abu Dhabi (AE)

( * ) Notice: Subject to any disclaimer, the term of this patent is extended or adjusted under 35 U.S.C. 154(b) by 145 days.

(21) Appl. No.: 16/174,060

(22) Filed: Oct. 29, 2018

(65) Prior Publication Data

US 2019/0132602 A1    May 2, 2019

Related U.S. Application Data

(60) Provisional application No. 62/578,299, filed on Oct. 27, 2017.

(51) Int. Cl.
*H04N 19/423* (2014.01)
*H04N 19/635* (2014.01)
*G11C 13/00* (2006.01)
*G11C 11/56* (2006.01)

(52) U.S. Cl.
CPC ........ *H04N 19/423* (2014.11); *G11C 11/5642* (2013.01); *G11C 13/004* (2013.01); *H04N 19/635* (2014.11)

(58) Field of Classification Search
CPC ............... H04N 19/423; H04N 19/635; G11C 11/5642; G11C 13/004
USPC ........................................................ 382/166
See application file for complete search history.

(56) References Cited

U.S. PATENT DOCUMENTS

| 10,008,264 B2* | 6/2018 | Ge ..................... G11C 7/1006 |
| 2019/0122727 A1* | 4/2019 | Le Gallo-Bourdeau ..................... H04N 19/60 |
| 2019/0324205 A1* | 10/2019 | Sharma .............. G02B 6/12019 |

* cited by examiner

*Primary Examiner* — Wednel Cadeau
(74) *Attorney, Agent, or Firm* — Kilpatrick Townsend & Stockton LLP

(57) ABSTRACT

Data compression using a memristive crossbar is enabled. Conductances of memristors may be set such that the memristors of the crossbar act as coefficients of a wavelet transformation coefficient matrix with respect to voltage signals applied to input rows of the crossbar. The memristors may act as coefficients of the transpose of the wavelet transformation coefficient matrix when voltage signals are applied to input columns of the crossbar. Hence, the memristive crossbar may be used to implement a two dimensional (2D) discrete wavelet transform (DWT) on two dimensional data (e.g., image data) encoded in the voltage signals. The resulting currents in the columns of the memristive crossbar may be integrated and converted to voltage signals that are fed back into columns of the memristive crossbar such that the rows of the memristive crossbar output electronic signals that correspond to the image data compressed in accordance with Haar 2D-DWT image compression.

18 Claims, 7 Drawing Sheets

DATA COMPRESSION USING MEMRISTIVE CROSSBAR

CROSS-REFERENCE TO RELATED APPLICATIONS

This application claims the benefit of U.S. Provisional Application No. 62/578,299, filed Oct. 27, 2017, the entire contents of which are hereby incorporated for all purposes in their entirety.

TECHNICAL FIELD

This invention relates generally to electronic devices and more particularly to electronic devices capable of data compression.

BACKGROUND

As Internet-connected devices become ever more ubiquitous, such devices are becoming physically smaller and otherwise resource-constrained. One term that has been used to describe this trend is the emerging "Internet of Things" (IoT) which utilizes resource-constrained devices to enable various types of internetworked functionality with respect to the objects or things in our everyday environment. In particular, such devices include sensors of various types including imaging sensors. For resource-constrained and particularly energy-constrained devices, compression of sensor data is desirable as a way to efficiently use resources such as wireless transmission resources. However, data compression is itself a computationally intensive task which can cause a significant and possibly excessive draw on device resources.

In addition to the challenges of resource-constrained devices, there are drawbacks associated with conventional computing architectures. In some computers, improvements in memory speed could not match the speed up gain by processor frequency due to increased focus on logic gate density, which resulted in a communication bottleneck. Hence, researchers introduced cache memories closer to the processor to help alleviate the bottleneck and improve the overall system speed. As further enhancement in frequency for a single core could not be achieved due to IO bandwidth limit, the focus moved to multi-core systems combined with memory hierarchy. Although such architecture supports parallel computing, the speed-up gain of the system heavily depends on the ability to parallelize the software code on that architecture. Also, putting accelerators closer to the main memory and sending the result of the executed task instead of the whole data has helped to mitigate the memory access bottleneck. However, the "von Neumann bottleneck" is still there since data needs to be sent back and forth between the memory and core blocks. Increase memory size and hierarchy improves system performance but has negative impact on energy and area. It also adds complexity especially for multi-core where memory coherency need to be dealt with. It is estimated that data migration from off-chip memory to the last level cache (LLC) and through the cache hierarchy, buses, and register file can account for up to 66% of the total energy in data-intensive applications such as those involving data compression.

Conventional attempts to solve the problems of implementing data compression for resource-constrained devices have shortcomings. For example, some conventional attempts are costly, inefficient (e.g., with respect to power consumption, resource utilization, and/or physical space utilization) and/or ineffective (e.g., with respect to particular performance criteria for particular applications). Embodiments of the invention address these and other problems as will be apparent from the description below.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Data compression using a memristive crossbar is enabled. Conductances of memristors may be set such that the memristors of the crossbar act as coefficients of a wavelet transformation coefficient matrix with respect to voltage signals applied to input rows of the crossbar. The same memristors may act as coefficients of the transpose of the wavelet transformation coefficient matrix when voltage signals are applied to input columns of the crossbar. Hence, the memristive crossbar may be used to implement a two dimensional (2D) discrete wavelet transform (DWT) on two dimensional data (e.g., image data) encoded in the voltage signals. The resulting currents in the columns of the memristive crossbar may be integrated and converted to voltage signals that are feed back into the columns of the memristive crossbar such that the rows of the memristive crossbar output electronic signals that correspond to the image data compressed in accordance with Haar 2D-DWT image compression.

An electronic device for data compression may include a first voltage input circuit, a memristive crossbar circuit, a second voltage input circuit and a voltage output circuit. The first voltage input circuit may provide voltage signals based on the two dimensional data. The first memristive crossbar circuit may perform a first part of a two dimensional discrete wavelet transform of the two dimensional data based at least in part on the received voltage signals. The second voltage input circuit may provide voltage signals based on results of the first part of the two dimensional discrete wavelet transform to the memristive crossbar circuit such that the memristive crossbar circuit performs a second part of the two dimensional discrete wavelet transform of the two dimensional data based on the voltage signals. The voltage output circuit may provide a result of the two dimensional discrete wavelet transform corresponding to a compressed encoding of the two dimensional data. For example, the two dimensional data may be image data, and the compressed encoding of the image data may correspond to Haar two dimensional discrete wavelet transform image compression.

For a fuller understanding of the nature and advantages of the present invention, reference should be made to the ensuing detailed description and accompanying drawings.

BRIEF DESCRIPTION OF THE DRAWINGS

Various embodiments in accordance with the present disclosure will be described with reference to the drawings, in which.

Throughout the drawings, like reference numerals may represent like parts in several views.

DETAILED DESCRIPTION

In the following description, various embodiments of the present invention will be described. For purposes of explanation, specific configurations and details are set forth in order to provide a thorough understanding of the embodiments. However, it will also be apparent to one skilled in the art that the present invention may be practiced without the specific details. Furthermore, well-known features may be omitted or simplified in order not to obscure the embodiment being described.

In accordance with at least one embodiment of the invention, data compression using a memristive crossbar is enabled. A memristive crossbar may have rows and columns of electronic signal paths with memristors at intersections. Conductances of the memristors may be set such that the memristors of the crossbar act as coefficients of a wavelet transformation coefficient matrix with respect to voltage signals applied to input rows of the crossbar. The same memristors may act as coefficients of the transpose of the wavelet transformation coefficient matrix when voltage signals are applied to input columns of the crossbar. Hence, the memristive crossbar may be used to implement a two dimensional (2D) discrete wavelet transform (DWT) on two dimensional data (e.g., image data) encoded in the voltage signals. For example, pixel values of an image may be encoded as a series of voltage pulses (e.g., 0-31 pulses in a time period proportional to pixel intensity) and applied to rows of a memristive crossbar with conductances corresponding to a Haar 2D-DWT. The resulting currents in the columns of the memristive crossbar may be integrated with appropriate integration circuitry and converted to voltage signals (e.g., stored as resistance levels used to generate series of voltage pulses) that are feed back into the columns of the memristive crossbar such that the rows of the memristive crossbar output electronic signals (e.g., currents then further integrated) that correspond to the image data compressed in accordance with Haar 2D-DWT image compression. Significantly, although further memristive crossbars may be used for storage of data prior to feedback and/or after the 2D-DWT has been applied, only a single memristive crossbar is required to implement the 2D-DWT and hence data compression. In accordance with at least one embodiment of the invention, using memristive crossbars for data compression can yield improvements in data processing speed, energy usage and physical space utilization compared to conventional hardware data compression architectures, even more so when compared to conventional software data compression architectures.

Figure 1:
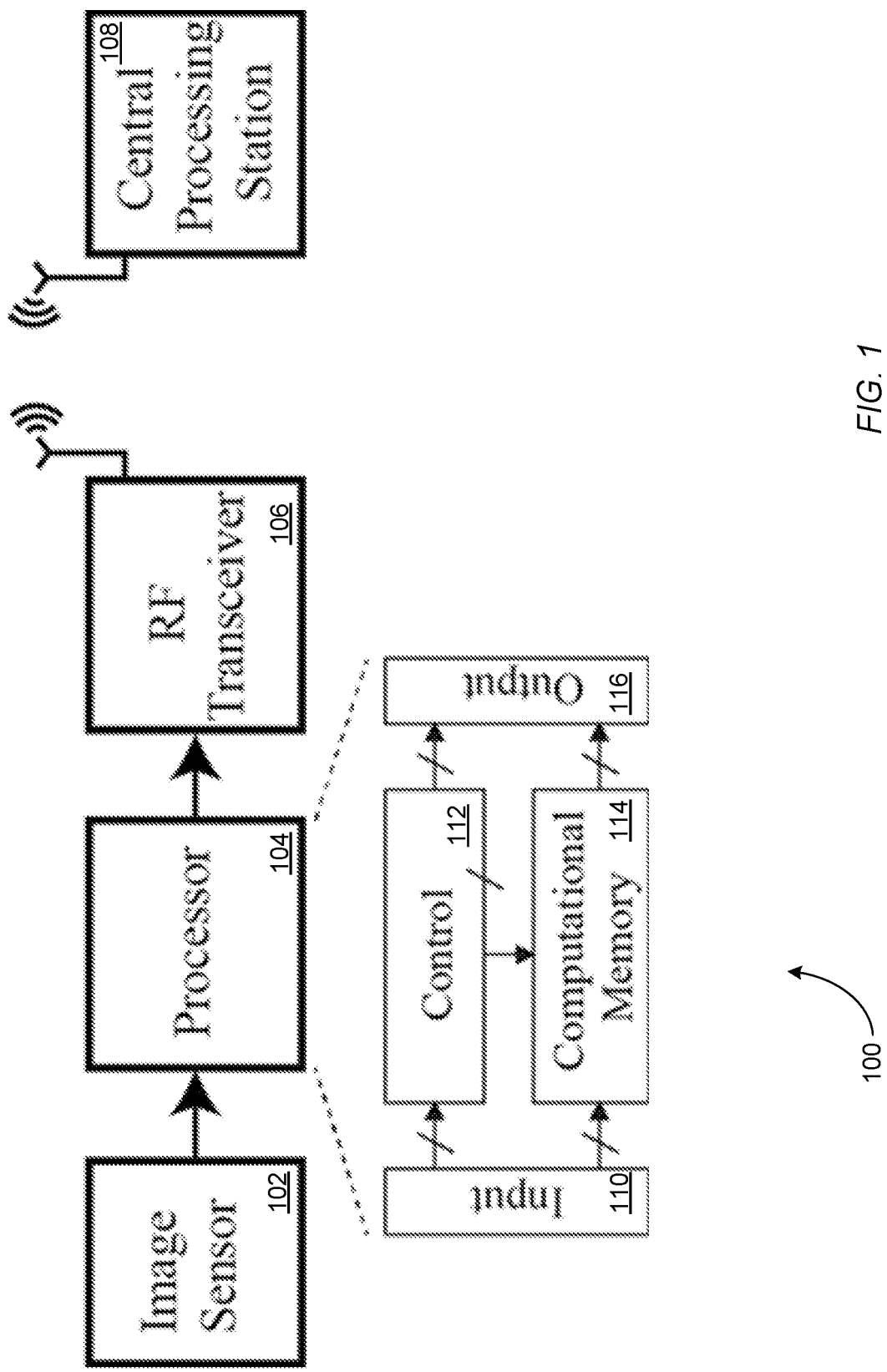
FIG. 1 is a schematic diagram depicting aspects of an example operational environment in accordance with at least one embodiment of the invention.

With the increasing number of "smart" objects and wireless IoT devices, such devices are expected to be a significant component in the semiconductor sector. The demand for higher processing speeds is likely to continue even in energy-constrained IoT nodes. Much of the information that will be processed within IoT devices is likely to be multimedia in nature, which can be computationally demanding. Image exchange over the IoT is a significant factor in various applications including smart health care, smart structures and transportation. FIG. 1 depicts an example operational environment 100 in accordance with at least one embodiment of the invention. A typical IoT node includes sensors such as an image sensor 102, an embedded processor 104, DAC/ADC, RAM and NVM and an RF transceiver 106 in communication with a central processing station 108. All these components are desirably realized in a single resource-constrained device to meet the small size and low cost requirements. System architectures and technologies that enable efficient computation in terms of speed and energy, such as those in accordance with at least one embodiment of the invention, are desirable.

Compression can be used to reduce data size as an effective way to reduce the overall energy consumption of connected IoT nodes. Image compression is a computationally intensive task which requires vector-matrix multiplication and matrix transpose operations. The memristor-based in-memory computing (IMC) architecture looks like a matrix and can be configured to realize the aforementioned operations and support parallelism. Herein is described a lossy Haar 2D-DWT image compression algorithm using memristor crossbar which shows savings in area, energy and computation speed.

Conventional software-based image compression algorithms suffer from high computational cost with limited performance since this method requires a significant amount of code which might exhaust the processing bandwidth of a typical low-power IoT embedded processor. Conventional hardware-based image compressor: are more energy-efficient with higher performance than the software-based solutions but they are still implemented on traditional digital computing systems that suffer from the well-known "von Neumann bottleneck."

In contrast, memristive crossbar based devices can exploit IMC where it combines both storage and computation using the same physical element. Memristive crossbar based devices include memristors connected in rows and columns (shown as computational memory 114 in FIG. 1) coupled with selective logic (control 112) to access each row and column. Although the terms "row" and "column" are used consistently throughout this description for clarity, one of skill in the art will appreciate that the description will apply mutatis mutandis should the terms be swapped. The control 112 can also store transformation coefficients into each memristor of the computational memory 114, e.g., coefficients of a wavelet transformation coefficient matrix. An input module 110 may map image pixels into voltage source and number of pulses to apply to the memristor array of the computational memory 114. The computational memory 114 may perform the data compression algorithm's multiply and add operations using the memristor array. An output module 116 can make compressed data accessible to further modules, circuits and components such as the RF transceiver 106.

There can be a big savings in area when using DWT (and/or a discrete cosine transform) as zero coefficient will not need a corresponding memristor/memory element. In accordance with at least one embodiment, memristor-based algorithms are lossy but can trade-off accuracy with savings in area, power consumption and processing speed. Applications include home appliances, smart phones, smart cameras, surveillance and augmented reality. It can be also used in implantable technologies, intensive diagnostic and monitoring apparatus and medical wireless applications.

In one example, a memristor-based image compression (MR-IC) architecture that exploits a lossy 2D-Discrete Wavelet Transform (DWT) is described. The architecture is composed of a computational memristor crossbar, an intermediate memory array that will hold the row transformed coefficients and a final memory that will hold the compressed version of the original image. The computational memristor array performs in-memory computation on the previously stored transformation coefficients.

Data compression is an important image processing technique that eliminates redundancy and transforms the acquired data into manageable size for efficient storage and transmission of visual information. Image compression is achieved by reducing the correlation between neighboring pixels (spatial redundancy) or between spectral bands (spectral redundancy) or between different frames in a video (temporal redundancy). Discrete wavelet transform (DWT) and the discrete cosine transform (DCT) are image compression algorithms. The wavelet transform presents a localized multi-resolution representation of a signal both in time and frequency presenting an advantage over other orthogonal transforms. While the DCT has better energy compaction representation as compared to the DWT, it has higher computational complexity. Accordingly, DWT has been used in wireless sensor networks (WSNs) and has shown higher peak signal-to-noise ratio (PSNR) and faster compression compared to DCT.

Image compression techniques can be implemented in software or hardware. From the software point of view, current image compression methods rely on performing a forward transform step which requires vector-matrix multiplication and matrix transpose operations. Such operations are not suitable for real-time IoT-based applications due to the high computational cost and impractical memory requirement. From hardware point of view, the complexity of the architecture is mainly divided into two: (i) arithmetic and (ii) memory components. The arithmetic component consists of multiply and add modules, while the memory component consists broadly of the transposition memory which holds the intermediate results. The complexity of the arithmetic component depends on the utilized computational scheme: (i) convolution-based or (ii) lifting-based. Convolution-based implementations trades area for reduction in computational time, which is neither desirable for high-speed nor low-power applications. On the other hand, lifting-based implementations require less memory with less computational complexity at the cost of having a long critical path.

Figure 2:
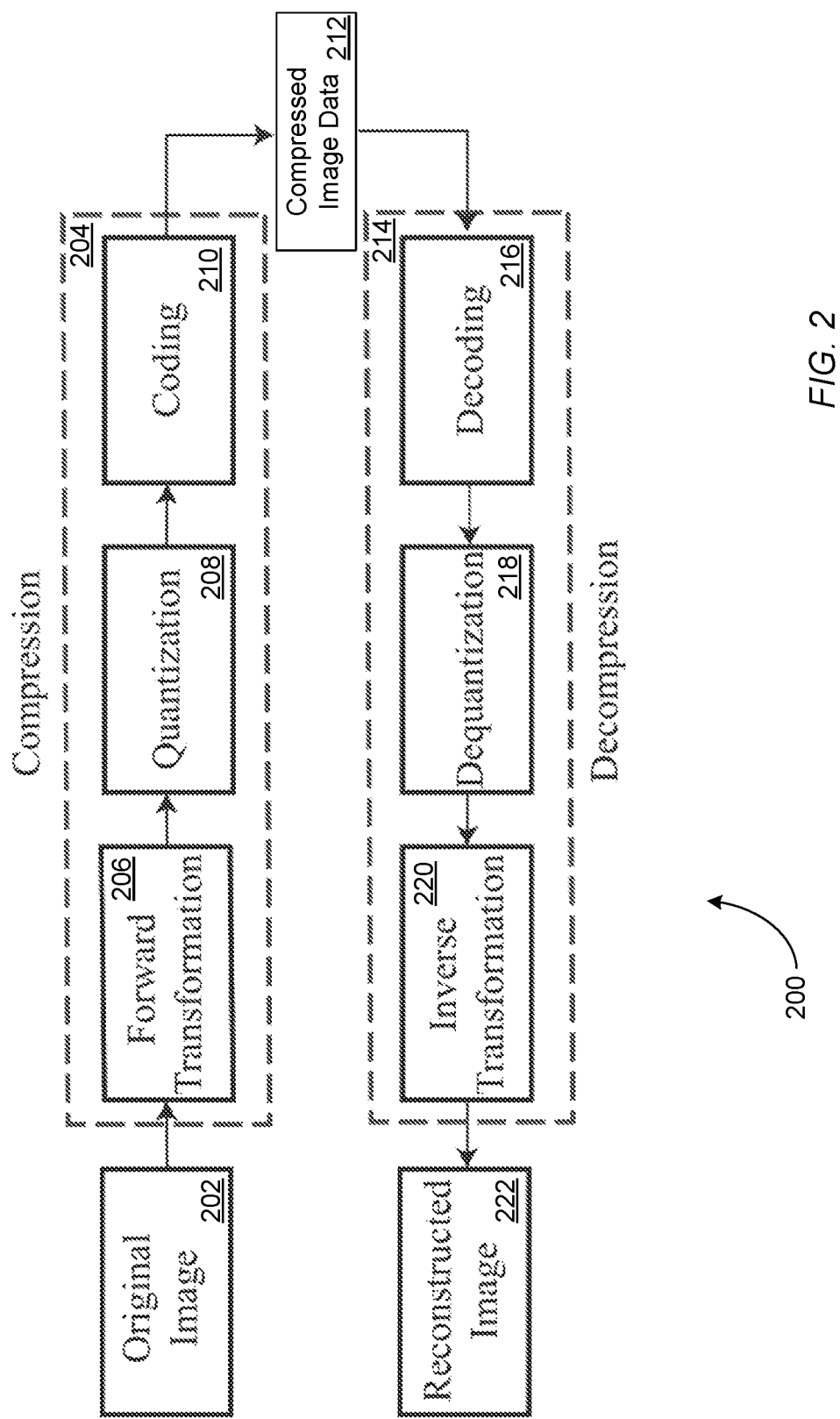
FIG. 2 is a data flow diagram depicting aspects of example image data processing in accordance with at least one embodiment of the invention.

FIG. 2 depicts an example data processing pipeline 200 for transmitting compressed images in accordance with at least one embodiment of the invention. An original or source image 202 is passed through a compression process 204 to generate compressed image data 212. The compressed image data 212 is transmitted to a remote location where it is passed through a decompression process 214 to generate a reconstructed image 222. The compressed data image 212 typically has a size that is much less than the size of the original image (e.g., as measured in bits of information). The compression process 204 may include one or more sub-processes such as a forward transformation 206, quantization 208 and coding 210. The decompression process 214 may include complementary sub-processes such as decoding 216, dequantization 218 and an inverse transformation 220.

Figure 3:
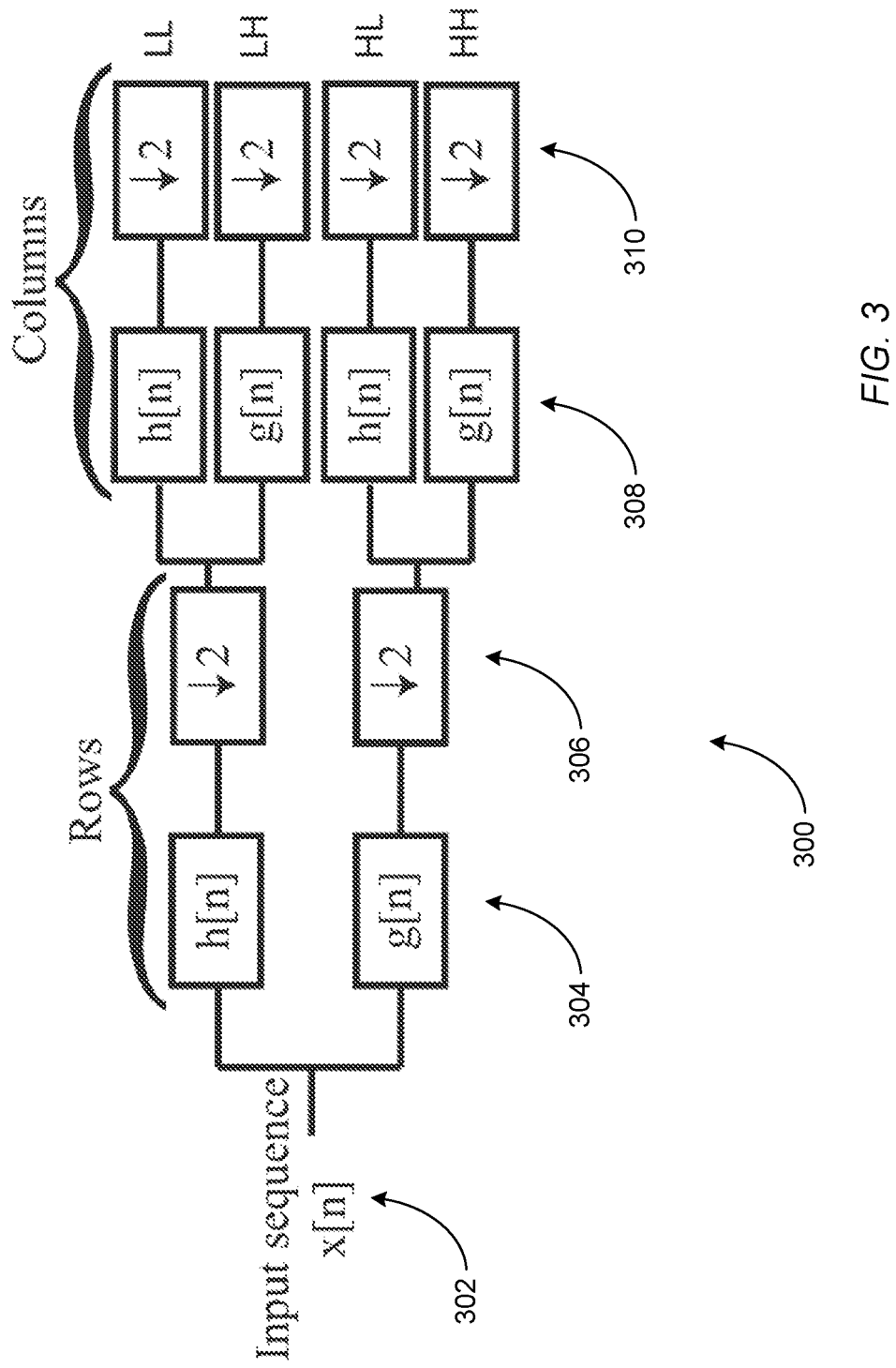
FIG. 3 is a data flow diagram depicting aspects of another example of image data processing in accordance with at least one embodiment of the invention.

For example, a 2D-Haar DWT is a convolution-based scheme where the inverse of the orthogonal filter bank is equal to the transpose. The method need only use two transformation coefficient values, namely $1/\sqrt{2}$ and $-1/\sqrt{2}$. The procedure starts by passing the image sequence through a series of high pass and low pass filtering and down-sampling operations that will eventually result in an approximation of the entire image. FIG. 3 depicts an example of image data processing 300 in accordance with an embodiment of the invention. The input sequence 302 being passed through high and low pass filters 304 and down-sampling operations 306 to generate two data streams for further processing (i.e., a high pass h[n] filtered data stream and a low pass g[n] filtered data stream). The process is then repeated (filtering 308 and down-sampling 310) for each stream to generate four distinct streams labeled LL, LH, HL and HH. The LPF calculates the averages of the coefficients, while the HPF produces the detail coefficients. An image is a two-dimensional (2D) matrix, where each pixel represents the intensity level at that point. A 2D-DWT performs decomposition on both the rows and the columns.

The original image is then decomposed into four sub-bands:

1) LL: provides an approximation (blurred) image with the maximum amount of information.
2) LH: extracts the horizontal features.
3) HL: extracts the vertical details.
4) HH: provides the diagonal features.

LH, HL and HH are high frequency bands details of the image. LL presents a low frequency component and is used for further decomposition levels. The number of times the decomposition process is repeated defines the number of transformation levels. Large matrix values indicate a large change while small values indicate a small change between pixel values in horizontal, vertical and/or diagonal directions.

The compressed image can be expressed and treated as a matrix-vector multiplication:

$$C = WIW^T = \begin{bmatrix} HIH^T & HIG^T \\ GIH^T & GIG^T \end{bmatrix}$$

where C is the compressed image, I is the original input image, W is the Haar wavelet transformation coefficient matrix and $W^T$ is the transpose of the transformation matrix. {WI} represents row transformation of the original image which is then multiplied by $W^T$ to perform column transformation. Both row and column transformation computations are based on multiply and accumulate operations. As can be seen, the W matrix is composed of H the low pass filter coefficients and G the high pass filter coefficients. The upper left corner of the matrix, the {$HIH^T$} block corresponds to the LL sub-band. The same applies to the other blocks and sub-bands.

Resistive RAM (RRAM), an emerging memory technology class promises to extend the trend of low power while maintaining low cost. Memristor, a type of RRAM which consists of a thin oxide film, stores information with zero leakage current, has high endurance, relatively fast write time and small cell size. The two-terminal device has shown both storage and information processing capabilities which makes it a potential building block for IMC voltage across it. Hence, the memristor can be modeled by two equations: one that relates the voltage across the memristor to the current passing through it, and another that describes an intrinsic property called the state variable and how this variable evolves with time. Various mathematical models exist in the literature to describe the two equations. These models can vary in complexity between: linear, non-linear and exponential models. The exponential model closely matches with the experimental results and captures the non-linearity of the electric field seen within the memristor.

Figure 4A:
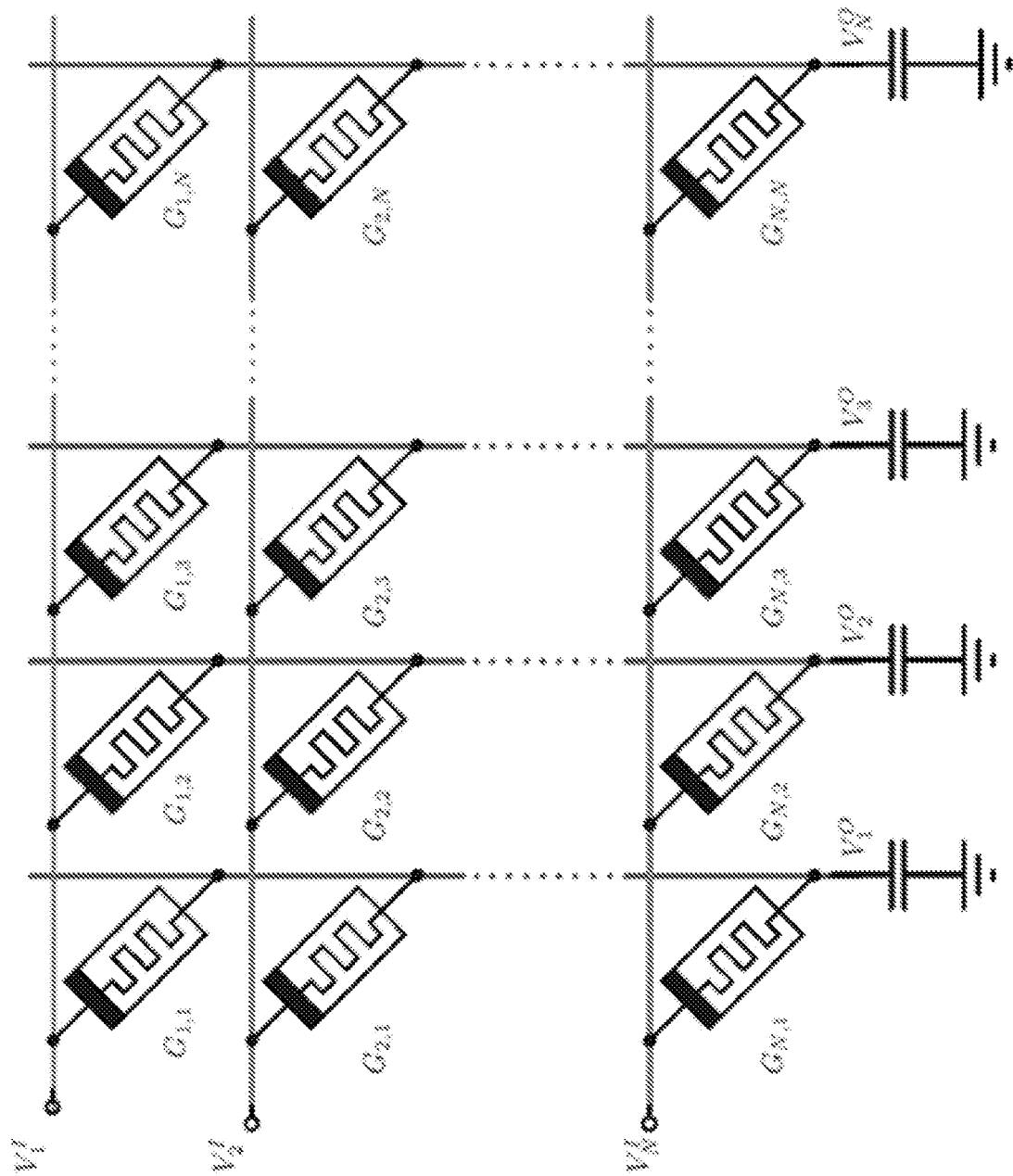
FIG. 4A is a circuit diagram depicting aspects of an example memristive crossbar in accordance with at least one embodiment of the invention.

As shown in FIG. 4A an example crossbar architecture 400 in accordance with at least one embodiment of the invention includes horizontal and vertical interconnects with a memristor constituted at each cross-point. In such architecture, the implementation of the dot product operation is possible, assuming that the read operation does not disturb the state of the memristor, as follows:

$$V_j^O = \frac{1}{cV_{out}} \int_0^T I_j dt$$

$$\text{where } I_j = \sum_{i=1}^N V_i^I G_{i,j}$$

Figure 4B:
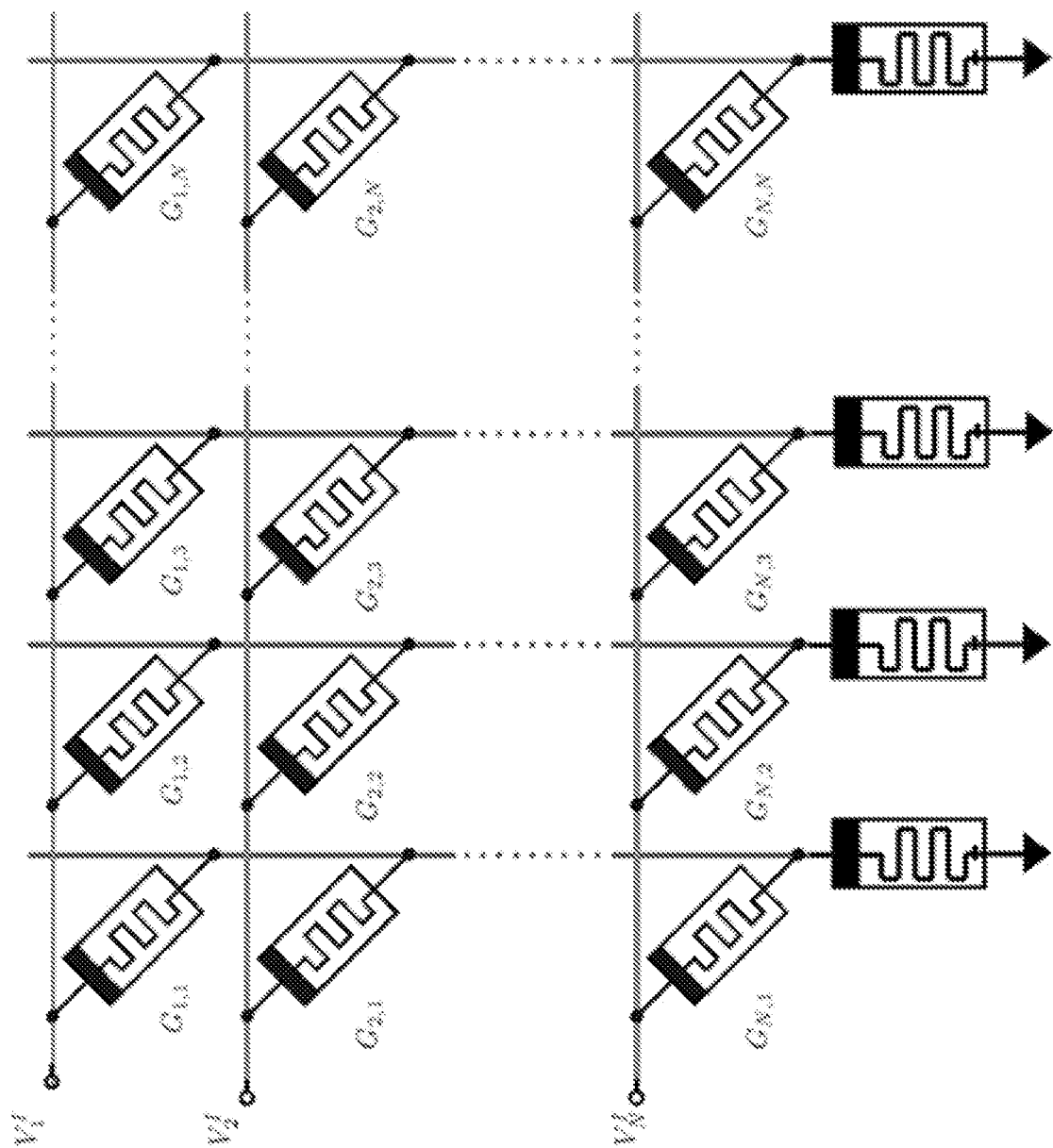
FIG. 4B is a circuit diagram depicting aspects of an example memristive crossbar in accordance with at least one embodiment of the invention.

The number of columns and rows in the matrix crossbar are represented by j and i, respectively. The input voltage vector is $V_i^I$, the conductance matrix of the memristors is $G_{i,j}$ and the output voltage vector is $V_j^O$. Since the horizontal top electrode is shared among all memristors in that row, then each junction device passes a current that is proportional to its current weight to the bottom electrode by obeying Ohm's law. Therefore, the output of a specific column is a weighted sum of all currents from all of the input units. The output current vector $I_j$ is then converted into $V_j^O$ by a sensing circuitry that can incorporate the value on an integrator (e.g., capacitor and/or memristor). The example architecture 400 utilizes capacitors in the role of integrator. FIG. 4B depicts another example crossbar architecture 402 in accordance with at least one embodiment of the invention. The example architecture 402 utilizes memristors in the role of integrator.

The matrix crossbar structure also simplifies the computation of the transpose vector-matrix multiplication. This is achieved by applying the input voltage vector to the column and taking the output from the rows.

For the crossbar array to perform the dot-product operation, two modes of operation may be employed:

1) Storage mode: tune the analog conductance values of the crossbar to represent a relatively fixed matrix.

2) Computing mode: perform the multiplication operation without disturbing the state of the memristors.

The 1R crossbar array architecture provides higher density than the conventional 1T1R grid architecture which includes a relatively large access transistor. Having a select transistor is helpful to mitigate the sneak path issue which arises during the write operation. Programming the memristor crossbar may be done during the fabrication process since it requires to store two fixed values only. Thus, the sneak path impact is minimal during dot-product operation. Furthermore, during read operation, all rows of the memristor crossbar are activated at once hence the impact of sneak path currents is minimal.

In accordance with at least one embodiment of the invention, image compression may be performed during the image-capture phase so the system is then expected to deliver a higher image quality at a higher processing rate and enable lower on-chip storage requirement. In a typical image processing pipeline, there is a de-mosaicing stage, which is sometimes referred to as color filter array (CFA) interpolation. The stage takes the single-color pixels raw data from the CMOS image sensor (CIS) and triples the amount of data by outputting three RGB components through interpolation. Then compression for the full colored image is performed at a later stage. The interpolation step consumes considerable amount of computational power, memory and transmission bandwidth in addition to the errors introduced by the operation. In an attempt to reduce to work on the grayscale (luminance) Y-component, and the full color will be reproduced at the image reconstruction side where more processing power is available. Therefore, after the CIS block comes the RGB-to-YUV converter then the Y-component is fed into the compressor. Since the whole intensity information resides in the Y-component, grayscale images were considered instead of colored ones to test the memristive array. Nevertheless, the work can be extended to RGB images by having a computational memristive crossbar for each color component (e.g., color channel and/or color space).

Figure 5:
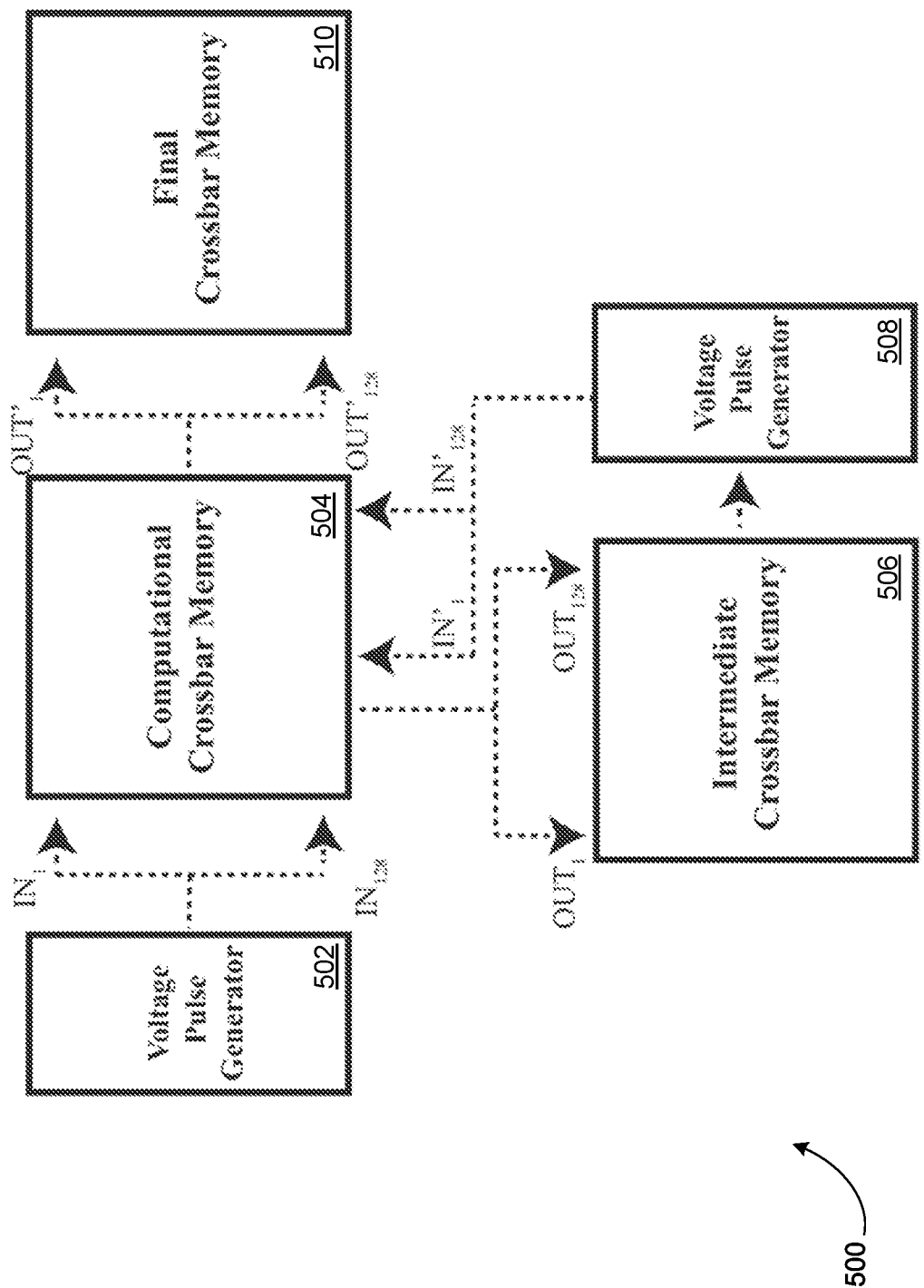
FIG. 5 is a schematic diagram depicting aspects of an example data compression architecture using memristive crossbars in accordance with at least one embodiment of the invention.

An example architecture 500 in accordance with at least one embodiment of the invention is depicted in FIG. 5. It includes three memristive crossbars:

1) Computational memristive crossbar 504: to realize the multiply-add operations.

2) Intermediate crossbar memory 506: to store the values of the row transformed coefficients.

3) Final crossbar memory 510: to store the values of the column transformed coefficients which represents the compressed image.

Electronic signals corresponding to pixel intensity values may be provided to a voltage pulse generator 502 (typically in a row-by-row, top left to bottom right) which, in turn, generates and provides corresponding series of voltage pulses to the computational memristive crossbar 504. A similar voltage pulse generator 508 may receive results stored in the intermediate crossbar memory 506 (e.g., partial 2D-DWT results) to generate and provide corresponding series of voltage pulses to the computational memristive crossbar 504. Where the voltage pulse generator 502 provides voltage pulses to the "rows" of the computational memristive crossbar 504, the voltage pulse generator 508 may provide its voltage pulses to the "columns" of the computational memristive crossbar 504, thereby multiplying by the transpose of the transform coefficient matrix and completing the 2D-DWT on the pixel intensity values.

In this example 500, multi-level voltage sensing circuitry (not shown in FIG. 5) may also be used to sense the accumulated charge on the integrator (e.g., capacitors and/or memristors) and generate corresponding voltage pulses to the intermediate 506 and final 510 memories in order to write the transformed pixel value as conductance level. Any suitable multi-level voltage sensing circuitry and/or voltage pulse generation circuits may be utilized. Examples of suitable circuits are described in J. C. Koob, S. A. Ung, B. F. Cockburn, and D. G. Elliott, "Design and characterization of a multilevel DRAM," IEEE Transactions on Very Large Scale Integration (VLSI) Systems, vol. 19, no. 9, pp. 1583-1596, 2011 and B. Liu, J. F. Frenzel, and R. B. Wells, "A multi-level DRAM with fast read and low power consumption," in Microelectronics and Electron Devices, 2005. WMED'05. 2005 IEEE Workshop on, pp. 59-62, IEEE, 2005. Moreover, a RRAM readout circuitry (not shown in FIG. 5) may be used to read from the intermediate 506 and final 510 crossbar arrays. Any suitable RRAM readout circuitry may be utilized. Examples of suitable circuits are described in M. Zidan, H. Omran, R. Naous, A. Sultan, H. Fahmy, W. Lu, and K. N.

Haar transformation coefficients may be mapped into state variable or conductance values in the memristor crossbar 504. In this example, an image size of 128×128 is assumed, and a matched size crossbar array is used. In accordance with at least one embodiment of the invention, crossbar array dimensions are no less than image dimensions.

The pixels of a grayscale image may be converted into appropriate number of voltage pulses representing the input voltage matrix, e.g., with the voltage pulse generator 502 of FIG. 5. If the pixel is black, which has a zero value, it is represented by one voltage pulse which is the minimum. While if it is white pixel, which has a value of 255, it is represented by the maximum number of pulses that is equal to 32 in this example. All the grayscale levels will take intermediate values between 2 and 31 pulses depending on their intensity. Then a row transformation operation may be performed followed by a column transformation operation. The row transformation operation includes applying the voltage pulses that correspond to the image pixels at the row terminals of the crossbar 504. Multiplication operation can be achieved by applying the input voltages to all the rows in the crossbar array, resulting in connecting the input voltage to all top electrodes. The resultant of this multiplication operation will be the current passing through each memristor, e.g., as depicted in FIG. 4.

The addition operation is achieved by the direct summing of all of the output currents resulting from the multiplication at each individual memristor. As shown in FIG. 4, the results are $I_j = \Sigma_{i=1}^{N} V_i^I G_{i,j}$.

Output currents may be accumulated on the capacitors and/or memristors and converted into voltages for the next column transformation step. Then, these voltages may be feedback to the crossbar, after sensing them, e.g., with the voltage pulse generator 508, by applying them to the columns and collecting the output from the rows. In this way, the matrix transpose operation is realized and the output will be stored in the final memristor crossbar 510 as a compressed version of the original image.

Only non-zero values of the transformation matrix were represented by a corresponding memristor. As some of these coefficients have a negative value, mapping these values to a negative conductance is not possible, instead the polarity of the applied voltage pulse is complemented. Finally mapping the intermediate values, from row transformation step and input to column transformation operation, may be performed as follows: the absolute values of the output were represented by a series of voltage pulses. Then the polarity of the negative output values were represented by changing the polarity of the applied voltage pulse. After the transformation, two lossy operations may be carried out: thresholding and quantization. For example, a hard threshold may be applied on the image.

Thresholding gets rid of the coefficients that fall below a certain predefined value and hold little useful information which the human eye cannot usually detect. This is because human eyes are less sensitive to high frequency signals and they average the fine details within a small area by acting as a low pass filter and only record the overall intensity of the area. After that, in the quantization process, the floating-point coefficients are rounded to the nearest integer resulting in further loss of information. Then comes the coding step which takes advantage of the zeros created in the high frequency zones. Entropy coding is a common example for the wavelets image transformation.

Matrix multiplication will result in m×n×c multiplications and m×c×(n−1) additions; where m represents the number of rows of the first matrix, n is the number of columns of the first matrix or rows of the second matrix and c is the number of columns of the second matrix. It is equivalent to $m^3$ multiplications and $m^2 \times (m-1)$ for square matrices. The memristor-based approach results in performing the [$128^3$ multiplications+($128^2 \times 127$) additions] in $128^2$ multiplications and additions. This means that using the memristor architecture, multiplication and addition are done in a single step which translates to m×m operations.

Figure 6:
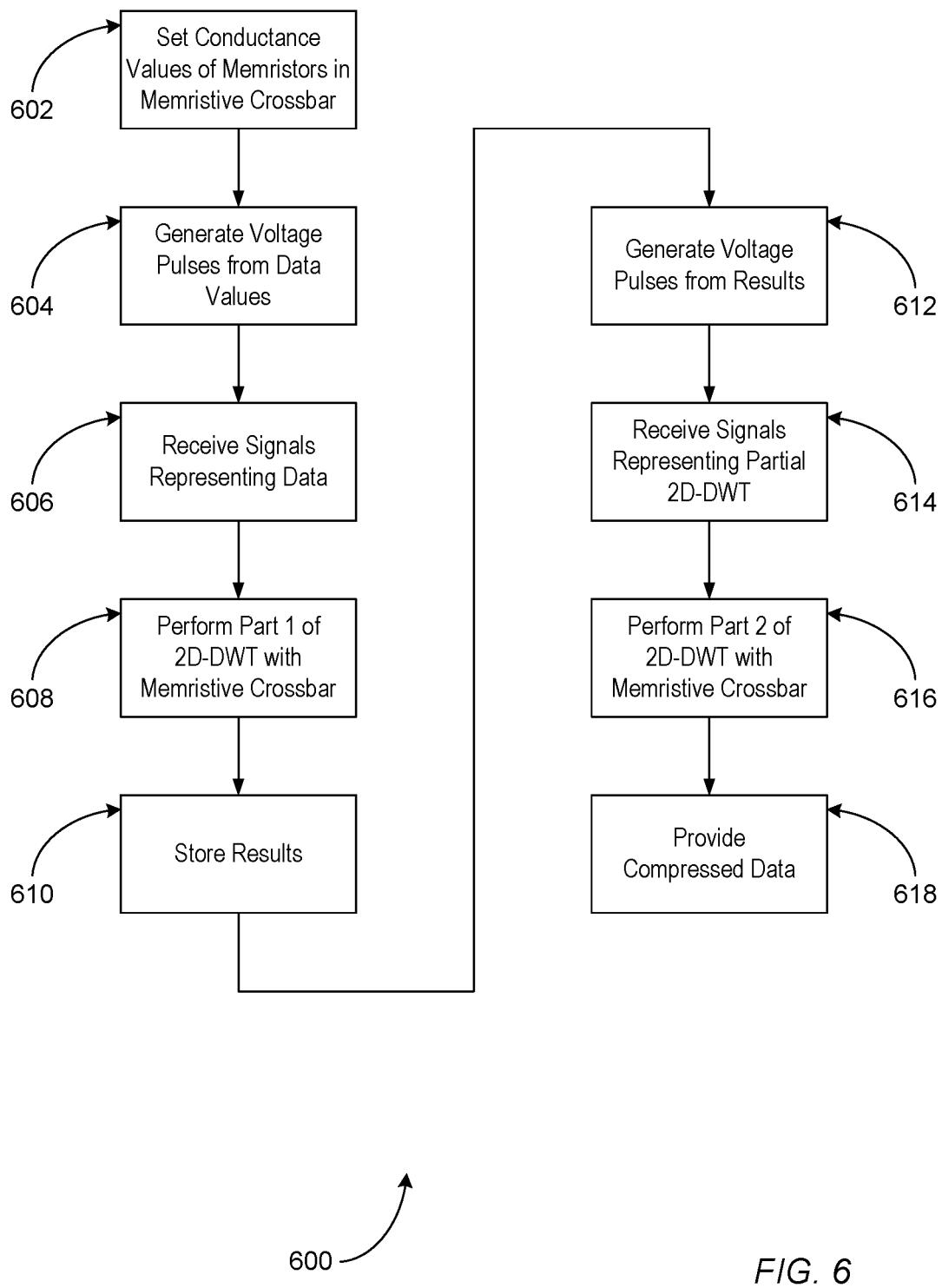
FIG. 6 is a flowchart depicting aspects of an example procedure in accordance with at least one embodiment of the invention.

Having described some structural aspects, the description now turns to procedures that may be performed in accordance with at least one embodiment of the invention. FIG. 6 depicts an example procedure that may be performed in accordance with at least one embodiment of the invention. At 602, conductance values of memristors in a memristive crossbar may be set. For example, conductance values of memristors in the computational crossbar memory 504 of FIG. 5 may be set to correspond to coefficients of a wavelet transformation coefficient matrix. At 604, a series of voltage pulses may be generated from two dimensional data values. For example, the voltage pulse generator 502 may receive electronic signals representing image pixel intensity values, and may generate corresponding series of voltage pulses, the number of voltage pulses in each generated series corresponding to a particular pixel intensity value.

At 606, electronic signals representing two dimensional data may be received. For example, the computational crossbar memory 504 of FIG. 5 may receive the series of voltage pulses generated by the voltage pulse generator 502 at the "rows" of the crossbar 504. At 608, a first part of a 2D-DWT may be performed with a memristive crossbar. For example, the voltage signals received at 606 may cause current flow in the properly configured computational crossbar memory 504 such that the current integrals in the columns correspond to results of a WI matrix multiplication operation described above. At 610, the results of the first part of the 2D-DWT may be stored, for example, by the intermediate crossbar memory 506.

At 612, voltage signals based on the results stored at 610 may be generated. For example, the voltage pulse generator 508 (FIG. 5) may generate series of voltage pulses such that each series of voltage pulses corresponds to a particular element of the results of the first part of the 2D-DWT. At 614, results representing a partial 2D-DWT may be received. For example, the computational crossbar memory 504 may receive the voltage signals generated at 612 from the voltage pulse generator 508 at the columns of the computational crossbar memory 504. At 616, a second part of the 2D-DWT may be performed with the memristive crossbar. For example, the voltage signals received at 606 may cause current flow in the computational crossbar memory 504 such that the current integrals in the rows correspond to results of a $\{WIW^T\}$ matrix multiplication operation described above. At 618, compressed two dimensional data may be provided. For example, the computational crossbar memory 504 may provide electronic signals representing results of 616 to the final crossbar memory 510 for storage, transmission and/or access by additional modules. For example, the compressed two dimensional data may include image data encoded in accordance with two dimensional discrete wavelet transform image compression. Where the W matrix coefficients, and corresponding memristor conductances, represent a Haar wavelet transformation coefficient matrix, the compressed two dimensional data may include image data encoded in accordance with Haar two dimensional discrete wavelet transform image compression. Although, advantageously and as described in this example, a single memristive crossbar may be utilized to perform both W matrix multiplication and its transpose, in accordance with at least one embodiment, two or more such computational crossbar memories may be utilized. For example, the intermediate crossbar memory may be configured as a computational crossbar to apply the transpose multiplication and the results stored in the final crossbar memory without feedback through the computational crossbar 504.

The ability of memristor crossbar to architecturally integrate computation with storage helps alleviate the von Neumann bottleneck and achieve savings in area, energy and speed. Accordingly, there are significant advantages that can be achieved by utilizing a memristor crossbar for image compression workload that relies heavily on dot product operations. Some of these advantages are a denser array on the same silicon area, savings in energy consumption (e.g., an order of magnitude savings) and significant reductions in area utilized. This is in addition to the acceleration in computation time (e.g., a 1.28 times speedup) and reduction in number of operations (e.g., an order of magnitude reduction) with the inherent property of parallel computing of the crossbar structure. Crossbar architectures in accordance with at least one embodiment of the invention provide desirable characteristics for WSN and IoT devices such as small size, low power and higher compression speeds. As another example, a 4-level memristor-based 2D-DWT which is the standard in image compression is also possible. In addition, it is possible to increase the accuracy of computation and reduction of noise by mapping intermediate values into appropriate voltage pulses representation, for example, at a higher resolution.

Embodiments of the invention may be implemented partially or entirely in hardware, for example, with one or more circuits such as electronic circuits, optical circuits, analog circuits, digital circuits, integrated circuits ("IC", sometimes called a "chip") including application-specific ICs ("ASICs") and field-programmable gate arrays ("FPGAs"), and suitable combinations thereof. In particular, the example data compression architecture 500 described above with reference to FIG. 5 may be partially or entirely implemented in hardware. As will be apparent to one of skill in the art, notions of computational complexity and computational efficiency may be applied mutatis mutandis to circuits and/or circuitry that implement computations and/or algorithms. Based on the disclosure and teachings provided herein, a person of ordinary skill in the art will know and appreciate other ways and/or methods to implement the present invention using hardware and/or a combination of hardware and software.

Appendix A includes further examples that may provide details and/or context with respect to embodiments in accordance with the invention including the example at least one embodiment described above with reference to FIGS. 1-6.

Other variations are within the spirit of the present invention. Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. An electronic device for image compression, comprising:
   a first voltage pulse generation circuit configured at least to generate a first plurality of input voltage pulses based at least in part on electronic signals corresponding to pixel values of an image;
   a first memristive crossbar circuit electronically coupled with the first voltage pulse generation circuit, the first memristive crossbar circuit having rows and columns of electronic signal paths with memristors at intersections and configured at least to receive the first plurality of input voltage pulses at inputs to the rows of the first memristive crossbar circuit and to perform a first part of a two dimensional discrete wavelet transform of the image based at least in part on the first plurality of input voltage pulses, wherein conductance values of the memristors in the first memristive crossbar circuit correspond to absolute values of coefficients of a wavelet transformation coefficient matrix such that a polarity of voltage pulses arriving at the corresponding memristor is caused to be complemented;

a second voltage pulse generation circuit electronically coupled with the first memristive crossbar circuit and configured at least to generate a second plurality of input voltage pulses based at least in part on results of the first part of the two dimensional discrete wavelet transform and to provide the second plurality of input voltage pulses to inputs of the columns of the first memristive crossbar circuit such that the first memristive crossbar circuit performs a second part of the two dimensional discrete wavelet transform of the image based at least in part on the second plurality of input voltage pulses; and a data storage circuit electronically coupled with the first memristive crossbar circuit and configured at least to store a result of the two dimensional discrete wavelet transform performed at least in part by the first memristive crossbar circuit such that the stored result corresponds to a compressed encoding of the image.

2. An electronic device in accordance with claim 1, further comprising a second memristive crossbar circuit electronically coupled with the first memristive crossbar circuit and the second voltage pulse generation circuit, the second memristive crossbar circuit configured at least to receive electronic signals corresponding to the results of the first part of the two dimensional discrete wavelet transform from the first memristive crossbar circuit and to store the results of the first part of the two dimensional discrete wavelet transform in a form accessible by the second voltage pulse generation circuit.

3. An electronic device in accordance with claim 1, wherein the data storage circuit comprises a third memristive crossbar circuit.

4. An electronic device in accordance with claim 1, wherein the two dimensional discrete wavelet transform is at least part of a Haar two dimensional discrete wavelet transform such that the compressed encoding of the image comprises an encoding in accordance with Haar two dimensional discrete wavelet transform image compression.

5. An electronic device in accordance with claim 1, wherein the image is a two dimensional image having rows and columns of pixels and the number of rows of the electronic signal paths of the first memristive crossbar circuit is no less than the number of the rows of pixels of the two dimensional image.

6. An electronic device in accordance with claim 1, wherein the first voltage pulse generation circuit generates a number of voltage pulses for each pixel of the image, the number of the voltage pulses corresponding to an intensity of the pixel.

7. An electronic device for data compression, comprising:
a first voltage input circuit configured at least to receive electronic signals representing two dimensional data and to provide a first plurality of voltage signals based at least in part on the received electronic signals;
a first memristive crossbar circuit electronically coupled with the first voltage input circuit, the first memristive crossbar circuit having rows and columns of electronic signal paths with memristors at intersections and configured at least to receive the first plurality of voltage signals and to perform a first part of a two dimensional discrete wavelet transform of the two dimensional data based at least in part on the first plurality of voltage signals, wherein conductance values of memristors in the first memristive crossbar circuit correspond to absolute values of coefficients of a wavelet transformation coefficient matrix such that a polarity of voltage pulses arriving at the corresponding memristor is caused to be complemented;

a second voltage input circuit electronically coupled with the first memristive crossbar circuit and configured at least to provide a second plurality of voltage signals based at least in part on results of the first part of the two dimensional discrete wavelet transform, the second plurality of voltage signals provided to the first memristive crossbar circuit such that the first memristive crossbar circuit performs a second part of the two dimensional discrete wavelet transform of the two dimensional data based at least in part on the second plurality of voltage signals; and a voltage output circuit electronically coupled with the first memristive crossbar and configured at least to provide electronic signals representing a result of the two dimensional discrete wavelet transform performed at least in part by the first memristive crossbar circuit such that the provided electronic signals correspond to a compressed encoding of the two dimensional data.

8. An electronic device in accordance with claim 7, wherein the first voltage input circuit comprises a voltage pulse generation circuit configured at least to generate a number of voltage pulses corresponding to a value of an element of the two dimensional data.

9. An electronic device in accordance with claim 7, further comprising a second memristive crossbar circuit electronically coupled with the first memristive crossbar circuit and the second voltage input circuit, the second memristive crossbar circuit configured at least to receive electronic signals corresponding to the results of the first part of the two dimensional discrete wavelet transform from the first memristive crossbar circuit and to store the results of the first part of the two dimensional discrete wavelet transform in a form accessible by the second voltage input circuit.

10. An electronic device in accordance with claim 9, wherein the second voltage input circuit comprises a voltage pulse generation circuit configured at least to generate voltage pulses representing the results of the first part of the two dimensional discrete wavelet transform such that the second plurality of voltage signals comprises the generated voltage pulses.

11. An electronic device in accordance with claim 7, wherein the first memristive crossbar circuit comprises accumulative elements electronically coupled with columns of electronic signal paths of the first memristive crossbar circuit such that the accumulative elements integrate current flowing through the columns of electronic signal paths.

12. An electronic device in accordance with claim 7, wherein the first memristive crossbar circuit has rows and columns of electronic signal paths with memristors at intersections such that conductance values of the memristors correspond to coefficients of a wavelet transformation coefficient matrix.

13. An electronic device in accordance with claim 12, wherein performing the first part of the two dimensional discrete wavelet transform corresponds to matrix multiplication with the wavelet transformation coefficient matrix and performing the second part of the two dimensional discrete wavelet transform corresponds to matrix multiplication with a transpose of the wavelet transformation coefficient matrix.

14. A method for compressing data with a memristive crossbar circuit, comprising:

setting conductance values of memristors in a first memristive crossbar circuit such that the conductance values correspond to coefficients of a wavelet transformation coefficient matrix, wherein when a coefficient of the wavelet transformation coefficient matrix has a negative value, the corresponding conductance value is set to a corresponding absolute value such that a polarity of voltage pulses arriving at the corresponding memristor is caused to be complemented;

receiving, by the first memristive crossbar circuit, a first plurality of voltage signals representing two dimensional data;

performing, by the first memristive crossbar circuit, a first part of a two dimensional discrete wavelet transform of the two dimensional data based at least in part on the first plurality of voltage signals;

receiving, by the first memristive crossbar circuit, a second plurality of voltage signals based at least in part on results of the first part of the two dimensional discrete wavelet transform;

performing, by the first memristive crossbar circuit, a second part of the two dimensional discrete wavelet transform of the two dimensional data based at least in part on the second plurality of voltage signals; and providing, by the first memristive crossbar circuit, electronic signals representing a compressed encoding of the two dimensional data based at least in part on results of the second part of the two dimensional discrete wavelet transform.

15. A method for compressing data in accordance with claim 14, further comprising generating, by a voltage pulse generation circuit, the first plurality of voltage signals including a plurality of a series of voltage pulses, each series of voltage pulses corresponding to a value of an element of the two dimensional data.

16. A method for compressing data in accordance with claim 14, further comprising:

storing, by a second memristive crossbar circuit, electronic signals representing the results of the first part of the two dimensional discrete wavelet transform; and generating, by a voltage pulse generation circuit, the second plurality of voltage signals including a plurality of series of voltage pulses, each series of voltage pulses corresponding to a value of a result of the first part of the two dimensional discrete wavelet transform stored by the second memristive crossbar circuit.

17. A method for compressing data in accordance with claim 14, wherein the two dimensional data represents a color image and the method further comprises converting the two dimensional data from an RGB color space to a YUV color space prior to generating the first plurality of voltage signals received by the first memristive crossbar circuit.

18. A method for compressing data in accordance with claim 14, wherein the two dimensional data represents a color image and the method further comprises performing a plurality of two dimensional discrete wavelet transforms with respect to a plurality of color components of the color image using a respective plurality of memristive crossbar circuits.

* * * * *